(12) United States Patent
Niwayama et al.

(10) Patent No.: US 7,291,535 B2
(45) Date of Patent: Nov. 6, 2007

(54) METHOD AND APPARATUS FOR FABRICATING SEMICONDUCTOR DEVICE

(75) Inventors: Masahiko Niwayama, Kyoto (JP); Kenji Yoneda, Kyoto (JP); Kazuma Takahashi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 293 days.

(21) Appl. No.: 11/000,209

(22) Filed: Dec. 1, 2004

(65) Prior Publication Data
US 2005/0130382 A1 Jun. 16, 2005

(30) Foreign Application Priority Data
Dec. 16, 2003 (JP) ............................. 2003-418125

(51) Int. Cl.
*H01L 21/336* (2006.01)
(52) U.S. Cl. ................ 438/302; 438/525; 257/E21.345
(58) Field of Classification Search ................ 438/302, 438/525, 529; 257/E21.345
See application file for complete search history.

(56) References Cited
U.S. PATENT DOCUMENTS
4,771,012 A * 9/1988 Yabu et al. ................. 438/302
4,877,962 A * 10/1989 Ohsaki et al. ....... 257/E21.345

FOREIGN PATENT DOCUMENTS
JP 2003-100902 4/2003

* cited by examiner

*Primary Examiner*—Chandra Chaudhari
(74) *Attorney, Agent, or Firm*—McDermott Will & Emery LLP

(57) ABSTRACT

A method for fabricating a semiconductor device includes the steps of: forming a semiconductor region of a first conductive type on a semiconductor wafer; forming a gate electrode on the semiconductor region; on the semiconductor region, forming a first insulating film over the whole surface including the upper surface of the gate electrode; by removing the formed first insulating film through etching from the top surface side, forming first sidewalls, covering the side surfaces of the gate electrode, from the first insulating film; and by implanting first impurity ions of a second conductive type to the semiconductor region by using an ion implantation device capable of processing a plurality of semiconductor wafers collectively, forming first impurity diffusion regions on both sides of the gate electrode in the semiconductor region. In the step of forming the first impurity diffusion regions, implantation of the first impurity ions are dividedly performed a plurality of times, and the semiconductor wafer is rotated in its wafer surface for each ion implantation.

10 Claims, 16 Drawing Sheets

FIRST TIME     SECOND TIME     THIRD TIME     FOURTH TIME

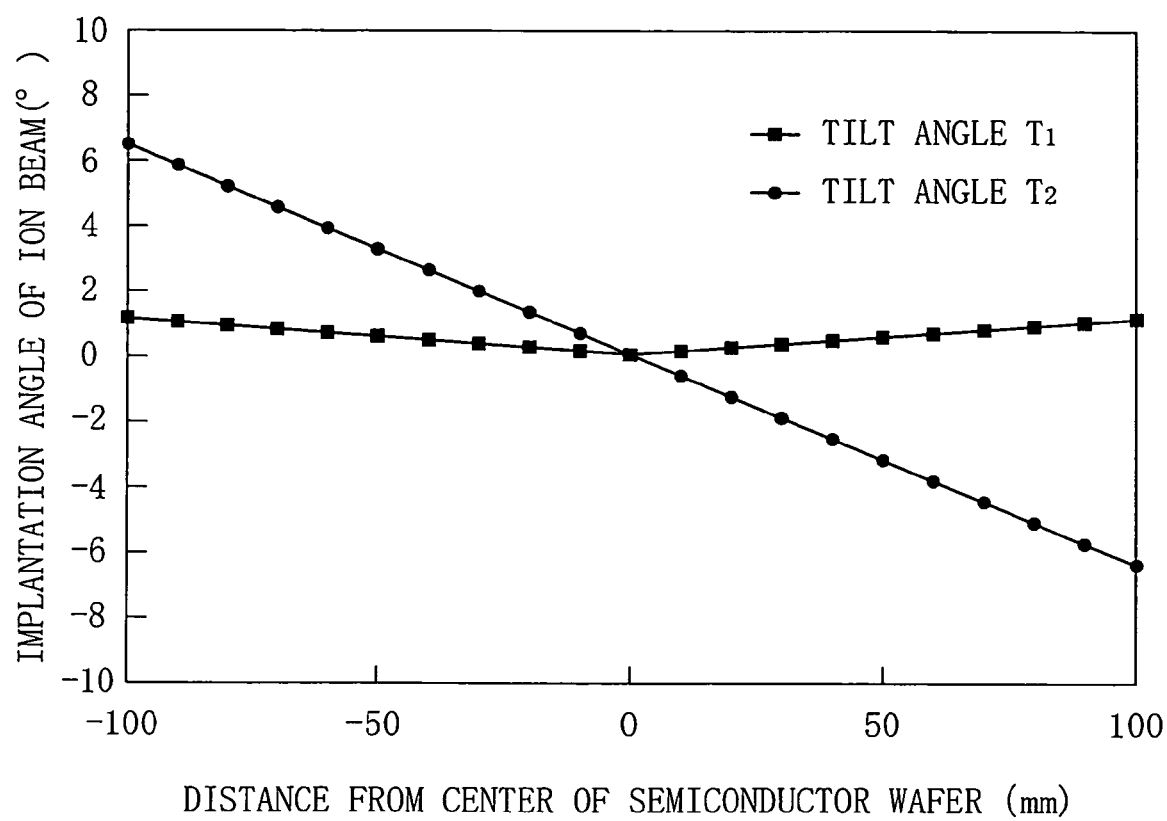

METHOD AND APPARATUS FOR FABRICATING SEMICONDUCTOR DEVICE

CROSS-REFERENCE TO RELATED APPLICATIONS

The entire disclosure of Japanese Patent Application No. 2003-418125 filed on Dec. 16, 2003 including claims, specification, and drawings are incorporated herein by reference.

BACKGROUND OF THE INVENTION

The present invention relates to a method for fabricating a semiconductor device and fabricating apparatus therefor, and in particular, to a method for fabricating a semiconductor device with extension regions connected with a source diffusion region and a drain diffusion region, and fabricating apparatus therefor.

Conventionally, in a process of forming a source diffusion region or a drain diffusion region for suppressing a short channel effect due to miniaturization of a MOS transistor, there is known a method in which offset sidewalls are formed on the side surfaces of a gate electrode, and ion implantation is performed by using the gate electrode and the sidewalls as masks, whereby a source diffusion region or a drain diffusion region is formed in a self-aligned manner.

For example, Japanese Patent-Application Laid-open No. 2003-100902 describes a method in which, by using offset sidewalls formed on the side surfaces of a gate electrode, a source diffusion region and a drain diffusion region, and extension regions of low concentration connected with the source diffusion region and the drain diffusion region, are formed through ion implantations performed in two stages.

Hereinafter, a conventional method for fabricating a MOS transistor with extension regions will be described with reference to drawings.

FIGS. 7A to 7C, 8A and 8B show sectional structures in the order of steps of a conventional method for fabricating a MOS transistor.

First, as shown in FIG. 7A, isolation films 102 are selectively formed on a semiconductor wafer 101 made of silicon, and p-type impurity ions are diffused in a region between the formed isolation films 102, to thereby form a well diffusion region 103. Then, on the semiconductor wafer 101, a silicon oxide film 104 and a poly-silicon film 105 are formed over the whole surface including the upper surfaces of the isolation films 102 and the well diffusion region 103.

Next, as shown in FIG. 7B, the poly-silicon film 105 and the silicon oxide film 104 are pattered in order, to thereby form a gate insulating film 104A from the silicon oxide film 104 and form a gate electrode 105A from the poly-silicon film 105. Then, on the semiconductor wafer 101, a first insulating film 106 made of silicon oxide is formed over the whole surface so as to surround the gate electrode 105A.

Next, as shown in FIG. 7C, first sidewalls 106A covering the side surfaces of the gate electrode 105A are formed by etching the first insulating film 106 from the top surface side, and n-type impurity ions are implanted through a low energy ion implantation using the gate electrode 105A and the first sidewalls as masks, to thereby form extension regions 107. Then, using the gate electrode 105A and the first sidewalls as masks, pocket regions 108 are formed by implanting (pocket implanting) p-type impurity ions through ion implantation in which an ion beam is tilted to the gate electrode 105A.

Here, the extension region 107 is a low concentration diffusion region connected with a source diffusion region or a drain diffusion region, and suppresses a short channel effect due to a miniaturization of a semiconductor device. The pocket region 108 is an impurity diffusion region of an opposite conductive type to the extension region 107, whereby it suppresses lateral spreading of a depletion region under the gate electrode 105A, and reduces a leakage current between the gate and the drain.

Next, as shown in FIG. 8A, on the semiconductor wafer 101, a second insulating film 109 made of silicon oxide is formed over the whole surface including the upper surfaces of the gate electrode 105A and the first sidewalls 106A.

Next, as shown in FIG. 8B, the second insulating film 109 is etched to thereby form second sidewalls 109A covering the sides of the first sidewalls 106A. Then, source/drain regions 110 made of n-type impurities are formed through ion implantation by using the second sidewalls 109A as masks.

According to the conventional method for fabricating a MOS transistor, the extension regions 107 and the source/drain regions 110 are formed in a self-aligned manner by using the first sidewalls 106A and the second sidewalls 109A as masks. Thereby, it is possible to form easily and securely a semiconductor device capable of suppressing a short channel effect due to miniaturization and reducing a leakage current between the gate and the drain.

In the conventional method for fabricating a MOS transistor, the step of forming the extension regions 107 needs to use an extremely low-energy ion beam. In general, a so-called batch-type ion implantation device is used, which device is so configured as to enable ion implantation to be performed collectively to a plurality of semiconductor wafers 101. In particular, an ion beam with low energy is difficult to be scanned by deflection, whereby ion implantation is performed to the whole surfaces of respective semiconductor wafers 101 by rotating and moving a wafer supporting board called a disk.

Hereinafter, a conventional batch-type ion implantation device will be described with reference to the drawings.

FIG. 9 is a perspective view showing the shape of a disk used for a conventional batch-type ion implantation device. As shown in FIG. 9, the conventional batch-type ion implantation device holds semiconductor wafers 101 to which ion implantation is performed, in a plurality of wafer holding areas 201a provided in the periphery of the circle disk 201. With this device, an ion beam 210 consisting of impurity ions to be implanted is irradiated to the semiconductor wafers 101, to thereby implant impurity ions to the semiconductor wafers 101.

The disk 201 is configured to be rotatable and movable by a rotation axis 202 and a scan axis 203. In FIG. 9, it is assumed that an extending direction of the rotation axis 202 is z axis, an extending direction of the scan axis 203 is y axis, and a direction vertical to the y axis and the z axis is x axis.

When implanting impurity ions over the whole surfaces of the semiconductor wafers 101 by using the conventional batch-type ion implantation device, the disk 201 is rotated about the rotation axis 202 at a high speed and the scan axis is moved reciprocally in the y direction. Thereby, impurity ions can be implanted to a plurality of semiconductor wafers 101 collectively and over the whole surfaces of respective wafers.

Further, in the conventional batch-type ion implantation device, a direction of implanting the ion beam 210 is fixed in a direction parallel to the z axis, and when adjusting the implanting angle of the ion beam 210 to the semiconductor wafers 101, the disk 201 is used to be tilted to the ion beam 210.

When forming the extension regions 107 shown in FIG. 7C by using the batch-type ion implantation device in FIG. 9, a method in which the ion beam 210 is implanted at once vertically to the semiconductor wafers 101, or a method in which the ion beam 210 is dividedly implanted four times from four directions by tilting the ion beam 210 to the semiconductor wafers 101, is generally used.

However, with the aforementioned conventional methods for fabricating a semiconductor device, it is difficult to surely form the extension regions 107, formed on the sides of the gate electrode 105, so as to be symmetrical to the gate electrode 105A on the both sides thereof, whereby a problem of asymmetry of the MOS transistor may arise.

Such an asymmetry of the MOS transistor is caused since, when forming the extension regions 107 using the conventional batch-type ion implantation device, the implantation angles of the ion beam 210 differs at the center and at the periphery of the semiconductor wafer 101 even though the angle of the ion beam 210 is set to be a certain value.

Implantation angles of the ion beam and the asymmetry of the MOS transistor will be described below with reference to the drawings.

FIG. 10A to 10C are illustrations explaining the angular relationships defined by the semiconductor wafer 101 and the ion beam 210 in the conventional batch-type ion implantation device. In FIGS. 10A to 10C, the disk 201 is expressed linearly for convenience of explanation. Further, in FIGS. 10A to 10C, an x axis, a y axis and a z axis conform to the x axis, the y axis and the z axis in FIG. 9, respectively.

As shown in FIG. 10A, in the disk 201, a wafer holding area 201a is provided to be tilted at a certain angle (cone angle A) to the rotation surface of the disk 201. The cone angle A is fixed at a certain value for each batch-type ion implantation device such that the semiconductor wafer 101 may be easily held by the wafer holding area 201a when the disk 201 rotates about the rotation axis 202.

Further, as shown in FIGS. 10B and 10C, a first jyro angle $B_1$ and a second jyro angle $B_2$ of the disk 201 can be set to be desired values, whereby the angle of the semiconductor wafers 101 to the ion beam 210 can be adjusted. In FIGS. 10B and 10C, cases where the first jyro angle $B_1$ and the second jyro angle $b_2$ are 0° (that is, in the initial state where the disk 201 is disposed in parallel with the xy plane) are shown by dotted lines. The first jyro angle $B_1$ is such an angle that the disk 201 rotates about the rotation axis 202 from the initial state in the y axis direction, and the second jyro angle $B_2$ is such an angle that the disk 201 rotates in the y axis direction.

FIGS. 11A to 11C are illustrations explaining implantation angles of the ion beam 210 in the conventional batch-type ion implanting device. As shown in FIG. 11A and 11B, an angle defined by the semiconductor wafer 101 and the ion beam 210 is expressed by two angles (that is, tilt angle $T_1$ and twist angle $T_2$). The tilt angle $T_1$ is defined by the normal (a line indicated by the dotted line in FIG. 11A) of the semiconductor wafer 101 and the ion beam 210, and the twist angle $T_2$ is defined by, assuming that a line linking a notch 110a showing the crystal orientation of the semiconductor wafer 101 and the center of the semiconductor wafer 101 is the reference line, the reference line and a projection line 210a showing the projection of the ion beam 201 to the semiconductor wafer 101.

Further, as shown in FIG. 1C, when the ion beam is irradiated to a point P rotated by a rotation angle C from the center of the semiconductor wafer 101 by rotating the disk 201 about the rotation axis 202, assuming that a line linking the center of the semiconductor wafer 101 and the center of the disk 201 is the reference line and that a vertical leg down from the point P to the reference line is a point Q, the rotation angle C is expressed as follows by using a distance $R_1$ from the center of the semiconductor wafer 101 to the point Q, and a distance $R_2$ from the point P to the point Q:

$$C = \tan^{-1}(R_2/R_1) \quad (1)$$

Then, at the point P, the tilt angle $T_1$ and the twist angle $T_2$ are expressed as follows:

$$T_1 = \cos^{-1}\{\cos(B_1-A)\cos B_2 \cos A + \sin B_2 \sin A \sin C - \sin(B_1-A)\cos B_2 \sin A \cos C\} \quad (2)$$

$$T_2 = \tan^{-1}(k/h) \quad (3)$$

provided that, in the equation (3), $k = \sin B_2 \cos C + \sin(B_1-A)\cos B_2 \sin$ $h = \cos(B_1-A)\cos B_2 \sin C + \sin(B_1-A)\cos B_2 \cos A \cos C - \sin B_2 \cos A \sin C$ As obvious from the equations (2) and (3), the tilt angle $T_1$ and the twist angle $T_2$ are functions of the rotation angle C, whereby their values change corresponding to the distance $R_2$ vertical to the reference line linking the center of the disk 201 and the center of the semiconductor wafer.

FIG. 12 is a graph showing the relationship between the distance $R_2$ from the center of the semiconductor wafer and the implantation angle of the ion beam. In FIG. 12, the lateral axis shows the distance $R_2$ from the reference line, linking the center of the disk 201 and the center of the semiconductor wafer 101, to the irradiating position of the ion beam, and the positive and negative symbols indicate directions to the reference line. The vertical axis shows the implantation angle (tilt angle $T_1$ and twist angle $T_2$) of the ion beam.

As shown in FIG. 12, although the tilt angle $T_1$ and the twist angle $T_2$ are set to be 0° at the center (R2=0) of the semiconductor wafer 101, it is obvious that the tilt angle $T_1$ and the twist angle $T_2$ change as they move away from the center of the semiconductor wafer 101. In this way, although the desired implantation angle has been set at the center of the semiconductor wafer 101, ion implantation is performed at an implantation angle different from the set implantation angle at the periphery of the semiconductor wafer 101.

Next, an influence of the shift in the implantation angle of the ion beam on the asymmetry of the MOS transistor will be described with reference to the drawings.

Here, assuming that in the two source/drain regions 110 formed on both sides of the gate electrode 105A, a drain current, in a case of applying a certain forward bias to respective regions so that one becomes a source region and the other becomes a drain region, is $I_{DS1}$, and a drain current, in a case of applying a reverse bias, is $I_{DS2}$, the asymmetry of the source/drain can be measured as $(I_{DS1}-I_{DS2})/I_{DS1}$.

FIG. 13 shows measurement values of the asymmetry of the source/drain as the distribution in the semiconductor wafer 101, when a plurality of MOS transistors with extension regions 107 are formed by using the batch-type ion implantation device shown in FIG. 9. In FIG. 13, a numeral value in a square in the semiconductor wafer 101 is a representative value showing the asymmetry of the source/drain of each MOS transistor disposed at a region where the square is located, and a mark of x or triangle attached on the upper right of each numeral value indicates that the value does not satisfy the asymmetry standard of the source/drain.

As shown in FIG. 13, the asymmetry of the source/drain increases from the center of the semiconductor wafer 101 to the periphery thereof. In recent years, it is required that the asymmetry of the source/drain is 3% or less, so this Figure shows that most parts in the periphery of the semiconductor wafer 101 do not meet the standard.

As described above, it is obvious that the asymmetry of the source/drain increases, as it moves away from the center of the semiconductor wafer 101, that is, as the shifted amounts of the tilt angle $T_1$ and the twist angle $T_2$ from the set values increase.

In order to improve the asymmetry of the source/drain, there has been tried a method in which the tilt angle $T_1$ is set to be larger than 0° in the step of forming the extension regions 107, and implantations are performed from four directions by changing the twist angle $T_2$.

FIGS. 14A and 14B show the relationship between the changing amount of the ion beam implantation angle and the distance from the center of the semiconductor wafer 101, when changing the set value of the twist angle $T_2$ in the conventional batch-type ion implantation device. FIG. 14A shows the relationship between the distance from the center of the semiconductor wafer 101 and the changing amount of the tilt angle $T_1$, and FIG. 14B shows the relationship between the distance from the center of the semiconductor wafer 101 and the changing amount of the twist angle $T_2$. In FIGS. 14A and 14B, the tilt angle $T_1$ at the center of the semiconductor wafer 101 is set to be about 7°.

As shown in FIGS. 14A and 14B, when changing the twist angle $T_2$ from 0° to 90°, 180° and 270°, the tilt angle $T_1$ changes in great amount in the periphery of the semiconductor wafer 101 when the twist angle $T_2$ is 90° and 270°, in particular. In the case of the tilt angle being 7°, if the values of the first jyro angle $B_1$ and the second jyro angle $B_2$ are $(B_1, B_2)=(7°, 0°)$, the twist angle $T_2$ is 0°, if $(B_1, B_2)=(0°, 7°)$, the twist angle $T_2$ is 90°, if $(B_1, B_2)=(-7°, 0°)$, the twist angle $T_2$ is 180°, and if $(B_1, B_2)=(0°, -7°)$, the twist angle $T_2$ is 270°. Accordingly, the changing amount of the tilt angle $T_1$ increases as the absolute value of the second jyro angle $B_2$ increases.

As described above, even when performing ion implantations from four directions by changing the twist angle $T_2$, the implantation angle, of the ion beam at the periphery of the semiconductor wafer 101 may change in great amount, depending on the value of the jyro angle.

FIGS. 15A and 15B show positioning relationships between the gate electrode 105A and the extension regions 107 in the case where the extension regions 107 are formed by performing the ion implantations four times as described above. FIG. 15A shows a MOS transistor at the center of the semiconductor wafer 101, and FIG. 15B shows a MOS transistor at the periphery of the semiconductor wafer 101. In FIGS. 15A and 15B, each numeral shown on the upper side indicates a distance from a side surface of the gate electrode 105A to the edge of the extension region 107. Further, the twist angle is changed by 90° sequentially, from 0° to 90°, 180° and 270° in the first to the fourth ion implantations.

As shown in FIG. 15A, at the center of the semiconductor wafer 101, the extension regions are formed symmetrical to the gate electrode 105A, from the first layered extension regions 107a formed by the first ion implantation to the fourth layered extension regions 107d formed by the fourth ion implantation. However, as shown in FIG. 15B, at the periphery of the semiconductor wafer 101, although the first layered extension regions 107a and the second layered extension regions 107b, formed by the first and the second ion implantations, respectively, are formed symmetrical to the gate electrode 105A, the third layered extension regions 107c and the fourth layered extension regions 107d, formed by the third and fourth ion implantations, respectively, are formed asymmetrical to the gate electrode 105A.

In this way, even though the ion implantations are performed from four directions by changing the twist angle $T_2$, it is obvious that the extension regions 107 cannot be formed symmetrical to the gate electrode 105A on the both sides thereof.

Further, as another method for improving the asymmetry of the source/drain, there is known a method in which the first sidewalls 106A, serving as masks when forming the extension regions 107, are filmed.

FIG. 16 is a graph showing the relationship between the distance from the center of the semiconductor wafer and the asymmetry of the source/drain when the offset film thickness of the first sidewall 106A (that is, the width of the bottom surface of the first sidewall 106 shown in FIG. 8B) is changed in the conventional method for fabricating a semiconductor device.

As shown in FIG. 16, as the offset film thickness of the first sidewall 106A increases, the asymmetry of the source/drain at the periphery of the semiconductor wafer 101 also increases. In order to make the asymmetry of the source/drain be 3% or less even at the periphery of the semiconductor wafer 101, the offset film thickness of the first sidewall 106A should be 3 nm or less, according to the Figure.

However, as the offset film thickness of the first sidewall 106A decreases, no effect of forming the first sidewalls 106A is achieved, whereby the extension regions 107 and the pocket regions 108 are not formed at the desired positions, and such effects as suppression of a short channel effect, reduction in gate leakage current, or the like cannot be achieved.

As described above, according to the conventional method for fabricating a semiconductor device, the implantation angle of the impurity ions changes in the wafer surface in the step of forming the extension regions using a batch-type ion implantation device, whereby the extension regions cannot be formed symmetrical to the gate electrode, causing the asymmetry of the source/drain. Further, even if performing ion implantations from four directions with the tilt angle being greater than 0° in order to solve the asymmetry of the source/drain, the tilt angle and the twist angle are shifted from the set values at the periphery of the wafer, whereby it is impossible to realize MOS transistors having fine symmetry of the source/drain with high yield.

SUMMARY OF THE INVENTION

It is therefore an object of the present invention to solve the conventional problems described above, and to enable extension regions to be formed with fine symmetry to a gate electrode with high yield when forming the extension regions of low concentration connected with a source diffusion region and a drain diffusion region.

In order to achieve the aforementioned object, the present invention has such a configuration that when forming impurity diffusion regions serving as extension regions by ion implantations, the angle of a semiconductor wafer to the implanting direction of impurity ions is adjusted so that the implantation angle of the impurity ions does not differ at the center and at the periphery of the semiconductor wafer.

Specifically, a method for fabricating a semiconductor device according to the present invention comprises the steps of: forming a semiconductor region of a first conductive type (well diffusion region) on a semiconductor wafer; forming a gate electrode on the semiconductor region; forming a first insulating film over the whole surface including the upper surface of the gate electrode, on the semiconductor region; by removing the first insulating film through etching from the upper surface side, forming first sidewalls, covering side surfaces of the gate electrode, from the first insulating film; and by implanting first impurity ions of a second conductive type to the semiconductor region by using an ion implantation device capable of processing a plurality of semiconductor wafers collectively, forming first impurity diffusion regions (extension regions) on both sides of the gate electrode in the semiconductor region. In the step of forming the first impurity diffusion regions, implantation of the first impurity ions are dividedly performed a plurality of times, and the semiconductor wafer is rotated in its wafer surface for each ion implantation.

According to the method for fabricating a semiconductor device according to the present invention, the twist angle of the first impurity ions can be changed without changing the jyro angle of the ion implantation device, whereby the implantation angle of the impurity ions merely change in the surface of the semiconductor wafer. Therefore, the first impurity diffusion regions can be formed symmetrical to the gate electrode even at the periphery of the semiconductor wafer. Consequently, it is possible to form semiconductor devices having fine symmetry with high yield.

In the method for fabricating a semiconductor device of the present invention, the number of times of the first impurity ion implantations is preferably a multiple of 2.

In this case, when implanting the first impurity ions dividedly a plurality of times, the semiconductor wafer is preferably rotated by $180 \times n°$ (provided that n is a natural number).

In the method for fabricating a semiconductor device of the present invention, the number of times of the first impurity ion implantations is preferably a multiple of 4.

In this case, when implanting the first impurity ions dividedly a plurality of times, the semiconductor wafer is preferably rotated by $90 \times n°$ (provided that n is a natural number).

In the method for fabricating a semiconductor device of the present invention, it is preferable that, in the step of forming the first impurity diffusion regions, the first impurity ions be implanted such that an angle defined by a direction of implanting the first impurity ions and a vertical direction of the main surface of the semiconductor wafer is in a range of 0° to 10°.

In the method for fabricating a semiconductor device of the present invention, it is preferable that, in the step of forming the first impurity diffusion regions, the first impurity ions be implanted such that a direction of implanting the first impurity ions becomes vertical to the main surface of the semiconductor wafer.

In the method for fabricating a semiconductor device of the present invention, it is preferable that, in the step of forming the first insulating film, the thickness of a portion, formed on the semiconductor region, of the first insulating film be set to be 5 nm or more.

It is preferable that the method for fabricating a semiconductor device of the present invention further comprise the steps of: after the step of forming the first impurity diffusion regions, forming a second insulating film over the whole surface including the upper surfaces of the gate electrode and the first sidewalls, on the semiconductor region; by removing the second insulating film through etching from the upper surface side, forming second sidewalls, covering the first sidewalls, from the second insulating film; and by implanting second impurity ions of a second conductive type to the semiconductor region, forming second impurity diffusion regions on both sides of the gate electrode in the semiconductor region so as to be positioned outside the first impurity diffusion regions.

It is preferable that the method for fabricating a semiconductor device of the present invention further comprise the step of, between the step of forming the first impurity diffusion regions and the step of forming the second insulating film, forming third impurity diffusion regions so as to cover the bottoms of the first impurity diffusion regions by implanting third impurity ions of the first conductive type to the semiconductor region.

Apparatus for fabricating a semiconductor device comprises: a reaction chamber where impurity ions are generated; a wafer supporting board (disk) which is disposed inside the reaction chamber and has a plurality of wafer holders each of which holds a semiconductor wafer; and wafer rotator for rotating the semiconductor wafer in its wafer surface.

According to the apparatus for fabricating a semiconductor device according to the present invention, the twist angle of the first impurity ions can be changed without changing the jyro angle of the wafer supporting board, whereby the impurity ions can be so implanted that the implantation angle of the impurity ions merely change in the surface of the semiconductor wafer. Therefore, the first impurity diffusion regions can be formed symmetrical to the gate electrode even at the periphery of the semiconductor wafer. Consequently, it is possible to fabricate semiconductor devices having fine symmetry with high yield.

It is preferable that the apparatus for fabricating a semiconductor device of the present invention further comprise a preliminary exhaust chamber, connected with the reaction chamber, for carrying the semiconductor wafer to the inside of the reaction chamber while keeping the vacuum of the reaction chamber.

In the apparatus for fabricating a semiconductor device of the present invention, the wafer rotator is preferably disposed inside the preliminary exhaust chamber.

In the apparatus for fabricating a semiconductor device of the present invention, the wafer rotator is preferably disposed inside the reaction chamber.

BRIEF DESCRIPTION OF THE DRAWINGS

FIGS. 2A and 2B show the method for fabricating a semiconductor device according to the first embodiment of the present invention, in which FIG. 2A is a structural sectional view in the order of steps, and FIG. 2B is a plan view showing the state of the semiconductor wafer in the step shown in FIG. 2A.

FIGS. 4A and 4B show sectional structures of extension regions formed by the method for fabricating a semiconductor device according to the first embodiment of the present invention, in which FIG. 4A shows the center of the semiconductor wafer, and FIG. 4B shows positions where the extension regions are formed at the periphery of the semiconductor wafer.

FIG. 12 is a graph showing the relationship between the distance from the center of the semiconductor wafer and the implantation angle of the ion beam in the conventional batch-type ion implantation device.

FIGS. 15A and 15B are sectional views showing extension regions formed using the conventional batch-type ion implantation device, in which FIG. 15A shows the extension regions formed at the center of the semiconductor wafer, and FIG. 15B shows the extension regions formed at the periphery of the semiconductor wafer.

DETAILED DESCRIPTION OF THE INVENTION

First Embodiment

A method for fabricating a semiconductor device according to a first embodiment of the present invention will be described with reference to the drawings.

Figure 1A:
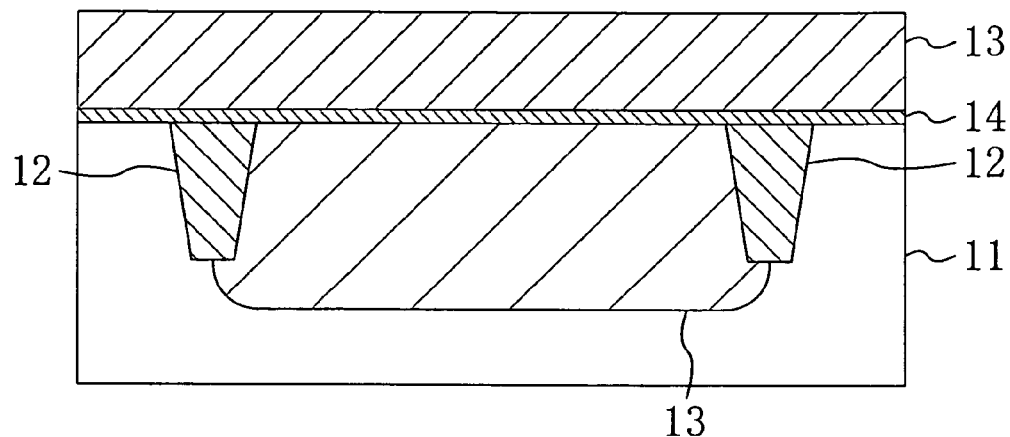
FIGS. 1A to 1C are structural sectional views in the order of steps showing a method for fabricating a semiconductor device according to a first embodiment of the present invention.
Figure 1B:
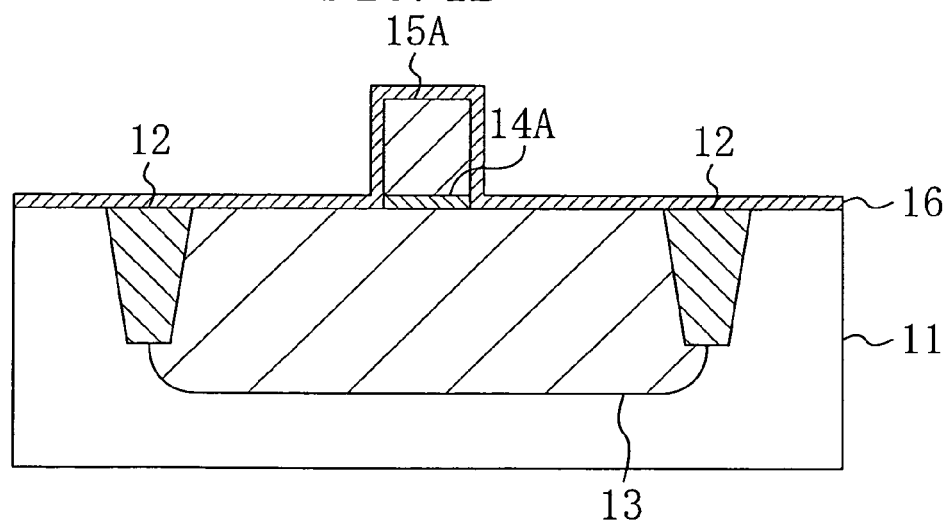
Figure 1C:
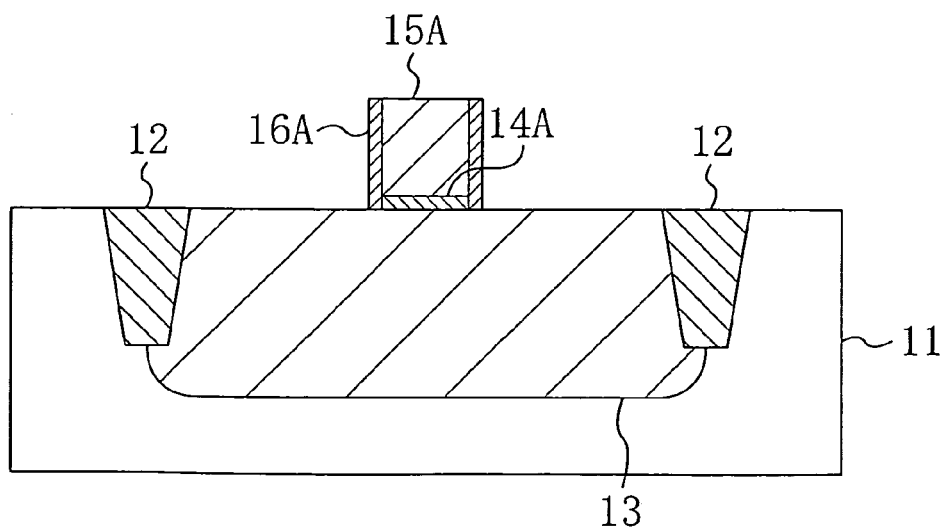
Figure 2A:
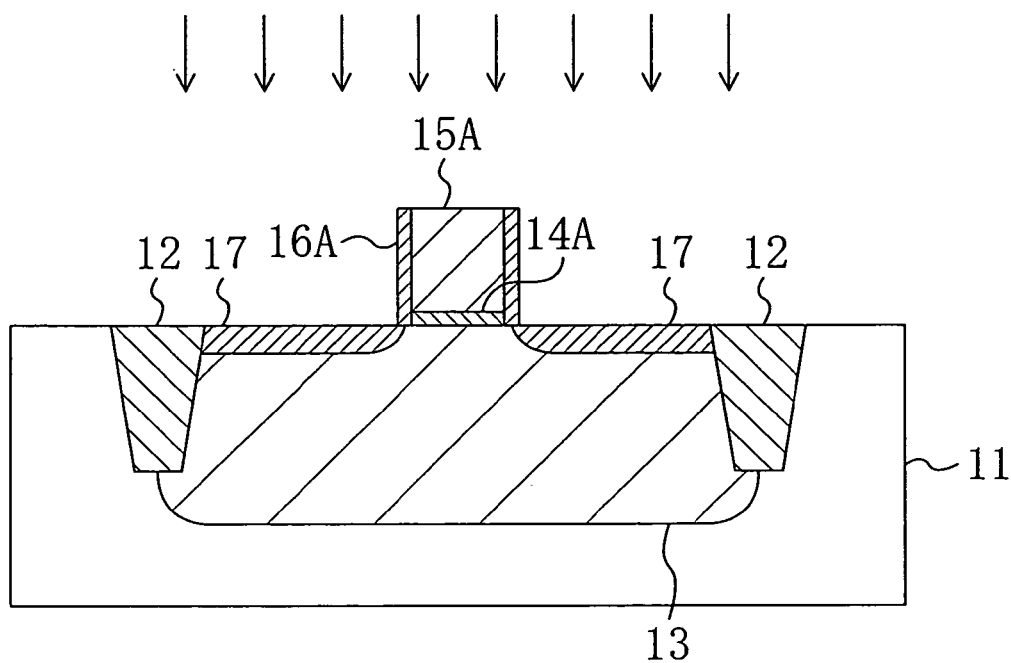
Figure 2B:
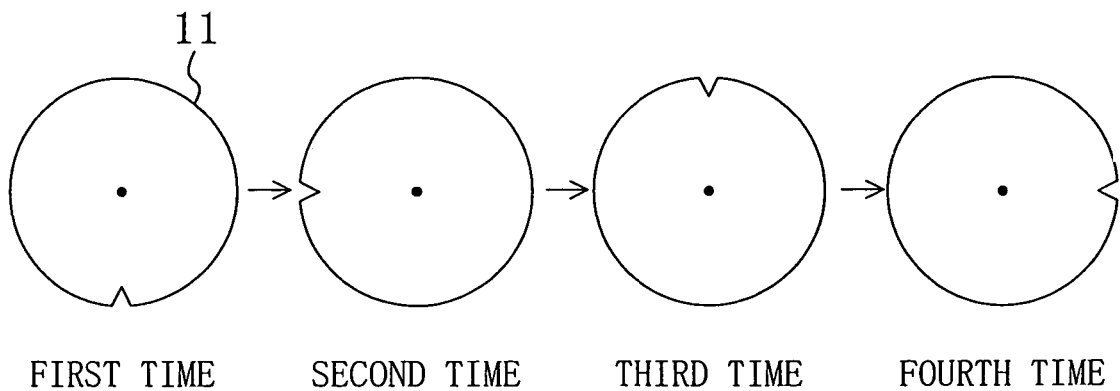

FIGS. 1A to 1C, 2A, 3A and 3B show sectional structures in the order of steps of the method for fabricating a semiconductor device according to the first embodiment of the present invention, and FIG. 2B shows the state of a semiconductor wafer in the step shown in FIG. 2A.

First, as shown in FIG. 1A, on a semiconductor wafer 11 made of, for example, silicon, isolation films 12 are selectively formed so as to define an element forming region, and first conductive type impurities are diffused between the isolation films 12, to thereby form a well diffusion region (semiconductor region) 13. Then, on the semiconductor wafer 11, a silicon oxide film 14 and a poly-silicon film 15 are formed in order over the whole surface including the upper surface of the well diffusion region 13.

Next, as shown in FIG. 1B, the poly-silicon film 15 and the silicon oxide film 14 are patterned in order by using the photolithography and dry etching, to thereby form a gate electrode 15A from the poly-silicon film 15 and also form a gate insulating film 14A from the silicon oxide film 14. Then, on the semiconductor wafer 11, a first insulating film 16 made of silicon oxide is formed over the whole surface including the upper surface and the side surfaces of the gate electrode 15A.

Next, as shown in FIG. 1C, the first insulating film 16 is etched from the top surface side, to thereby form first sidewalls 16A, from the first insulating film 16, covering the side surfaces of the gate electrode 15A.

Next, as shown in FIG. 2A, by using the gate electrode 15A and the first sidewalls 16A as masks, second conductive-type impurity ions are implanted at low energy through ion implantation using a batch-type ion implantation device, to thereby form extension regions 17 on both sides of the gate electrode 15A in the well diffusion region 13.

Figure 11A:
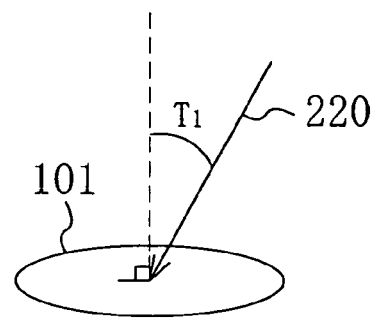
FIGS. 11A to 11C are illustrations explaining implantation angles of the ion beam in the conventional batch-type ion implantation device.

When performing the ion implantation using a batch-type ion implantation device, the tilt angle of the ion beam is set to be 0°. Here, the tilt angle is an angle showing the tilt of the ion beam to the main surface of the semiconductor wafer 11, which is defined by the normal direction of the main surface of the semiconductor wafer 11 and the direction of implanting the impurity ions. This angle is the tilt angle $T_1$ shown in FIG. 11A in the conventional ion implantation device.

Figure 11B:
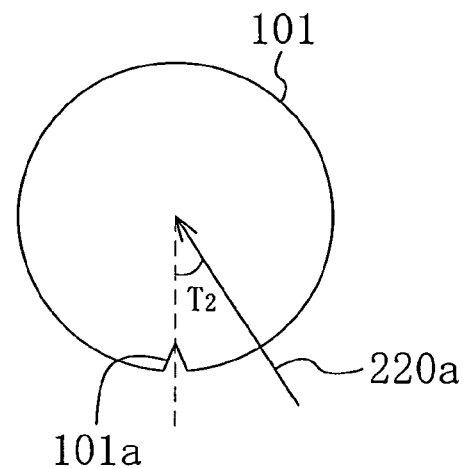
Figure 11C:
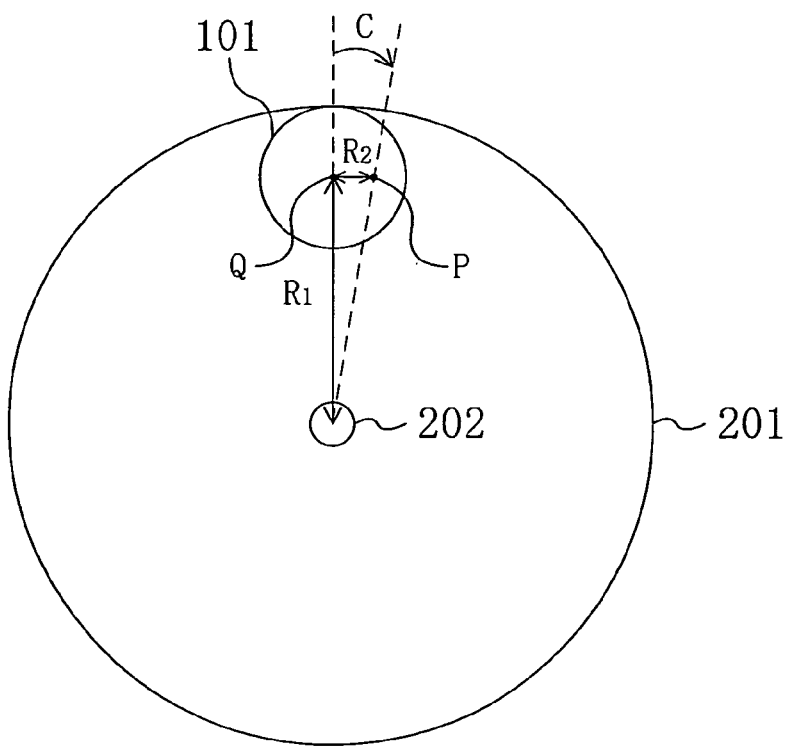
Figure 13:
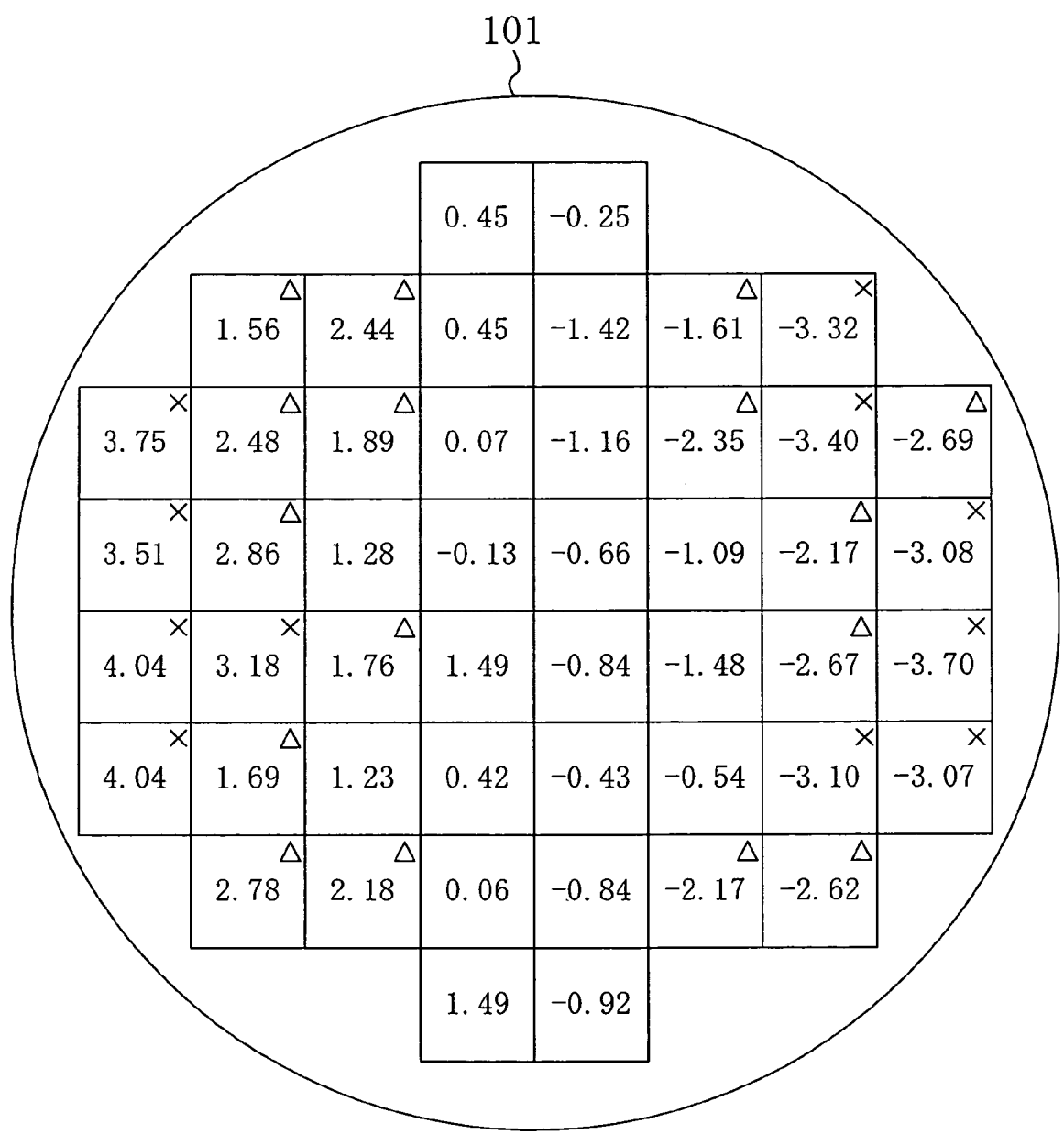
FIG. 13 is a map showing the distribution of the asymmetry of the source/drain in a MOS transistor formed using the conventional batch-type ion implantation device.
Figure 14A:
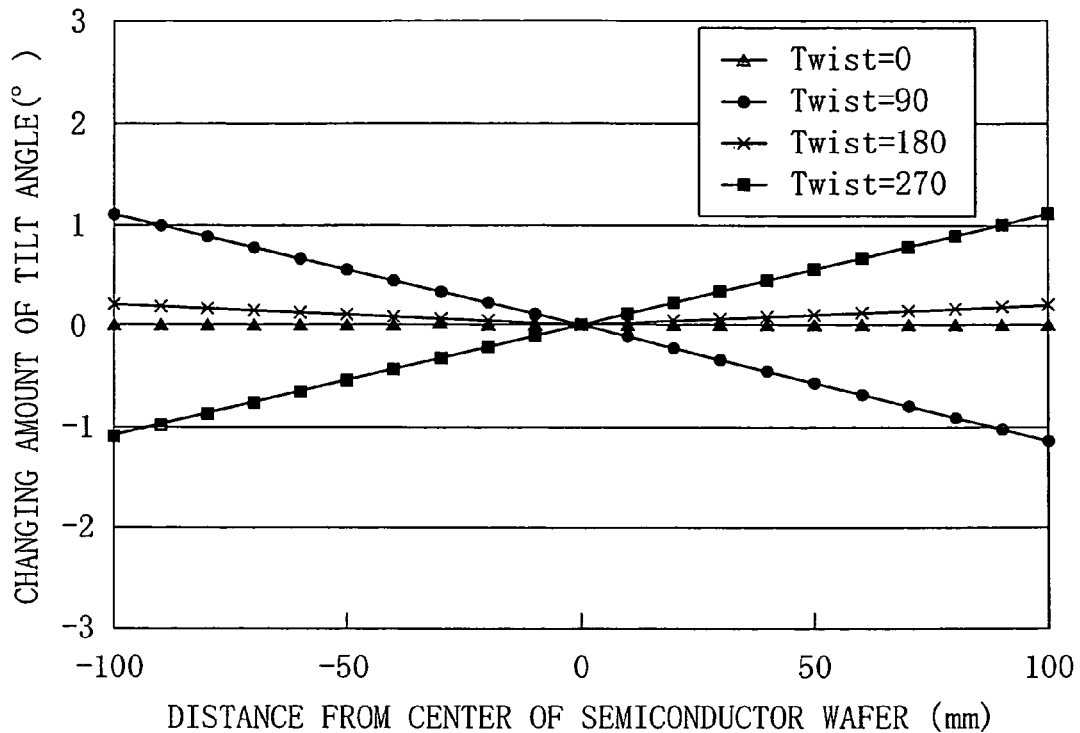
FIGS. 14A and 14B are graphs showing the relationship between the distance from the center of the semiconductor wafer and the changing amount in the implantation angle of the ion-beam in a case of changing the set value of a twist angle, in the conventional batch-type ion implantation device.
Figure 14B:
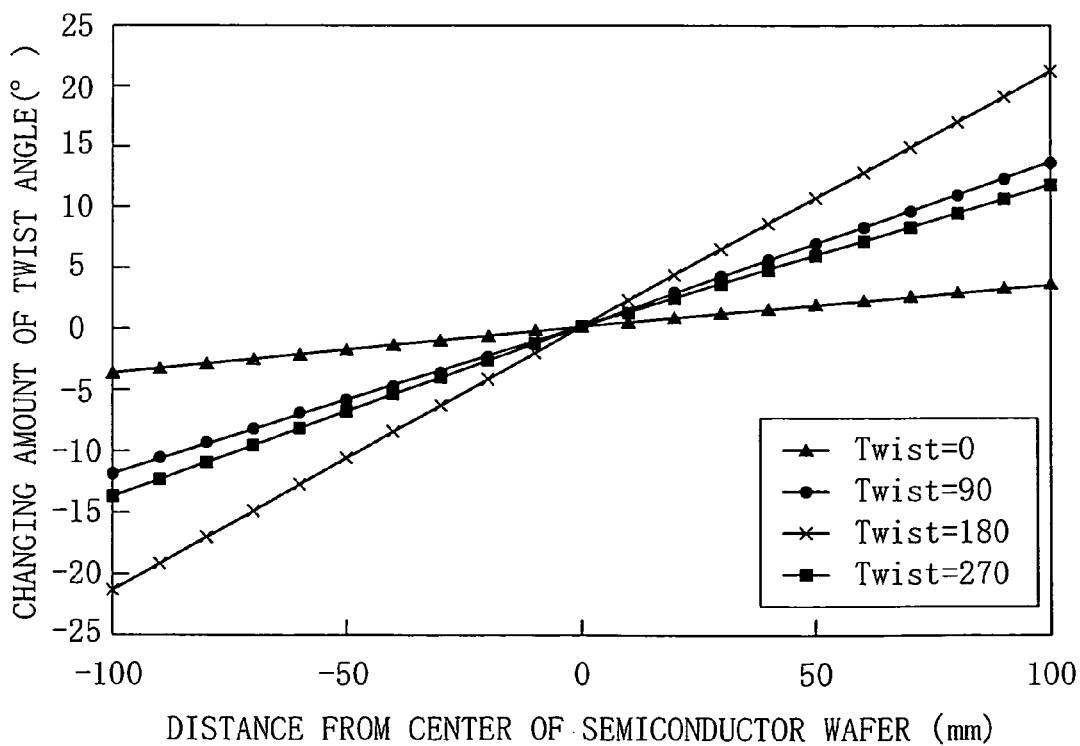
Figure 15A:
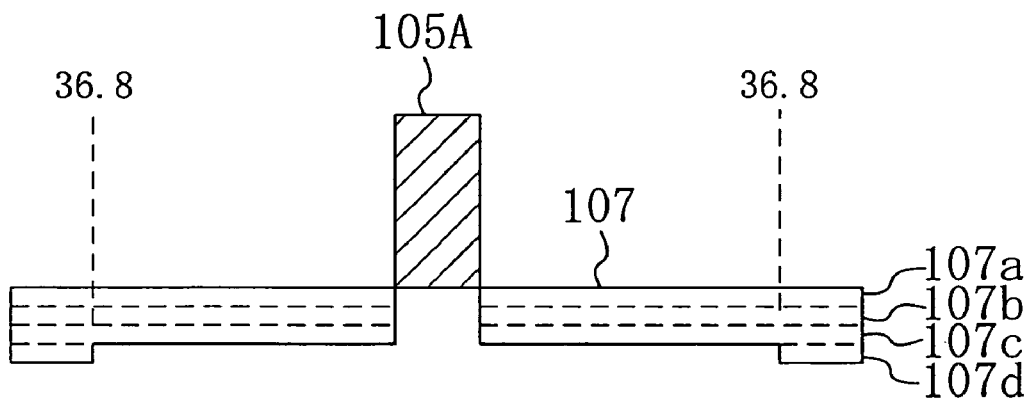
Figure 15B:
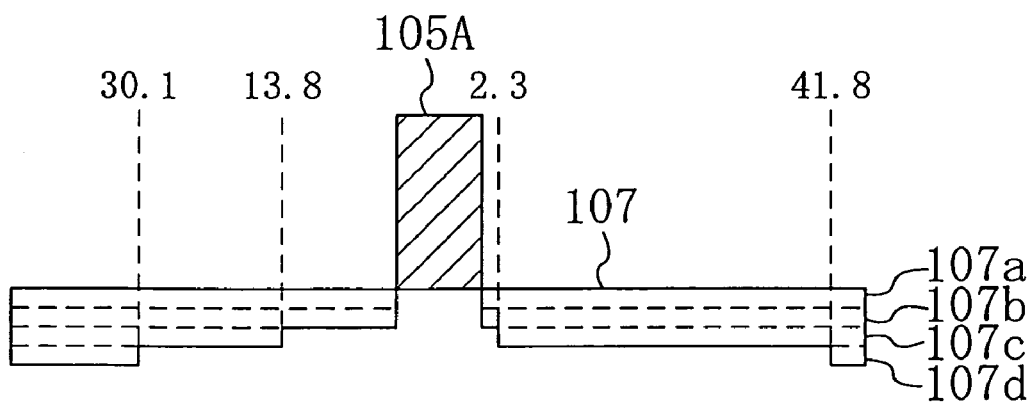
Figure 16:
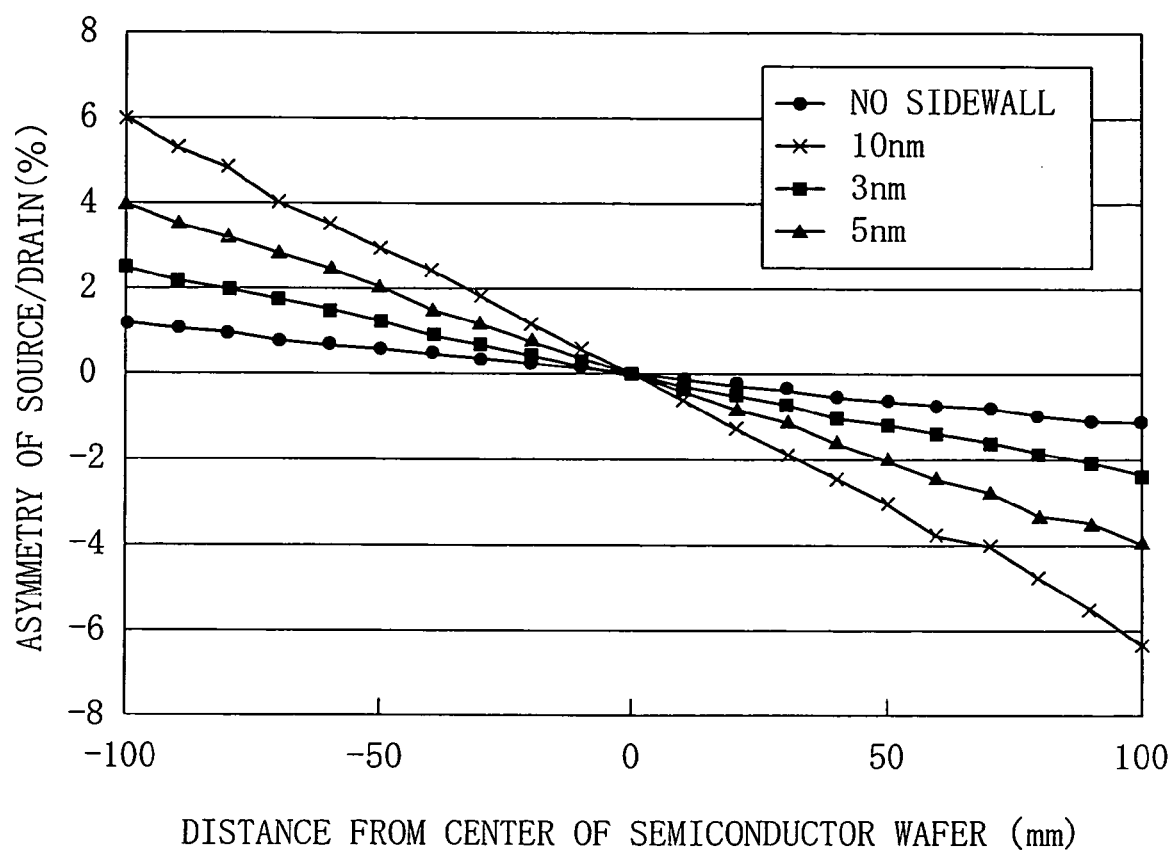
FIG. 16 is a graph showing the relationship between the distance from the center of the semiconductor wafer and the asymmetry of the source/drain in a case of changing the film thickness of a first sidewall, in the conventional method for fabricating a semiconductor device.

Here, when forming the extension regions 17, ion implantations are performed four times, in which the twist angle is changed by 90° from the first time to the fourth time, as shown in FIG. 2B. The twist angle is an angle showing the tilt of the ion beam to the main surface of the semiconductor wafer 11, which is defined by a projection line showing the projection of the ion beam to the semiconductor wafer 11 and the reference line of the ion implantation device. This angle is the twist angle $T_2$ shown in FIG. 11B in the conventional ion implantation device.

Figure 9:
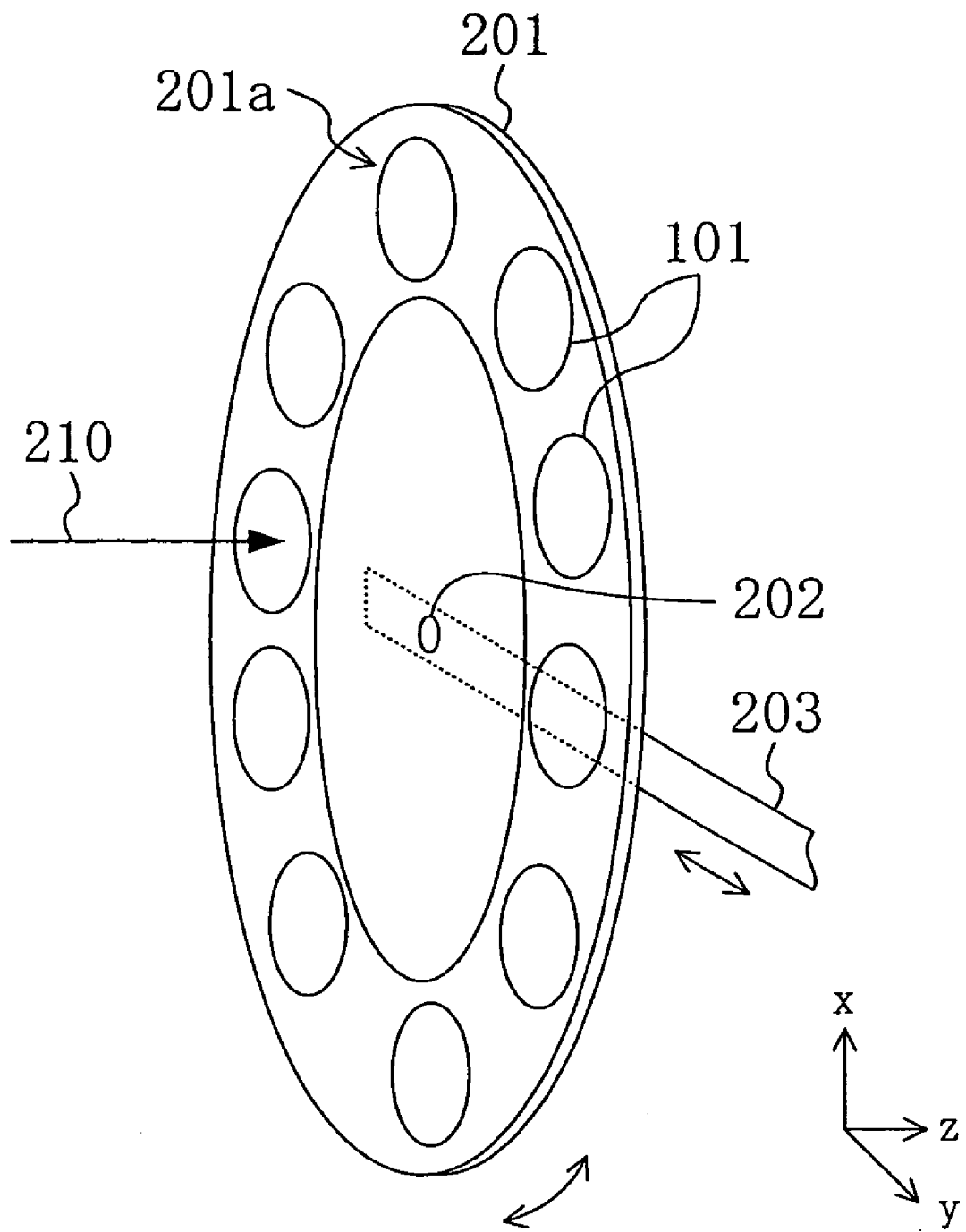
FIG. 9 is a perspective view showing a conventional batch-type ion implantation device.
Figure 10A:
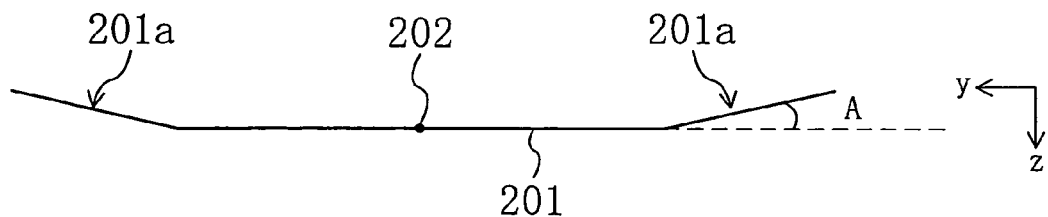
FIGS. 10A to 10C are illustrations explaining disk angles to the ion beam in the conventional batch-type ion implantation device.
Figure 10B:
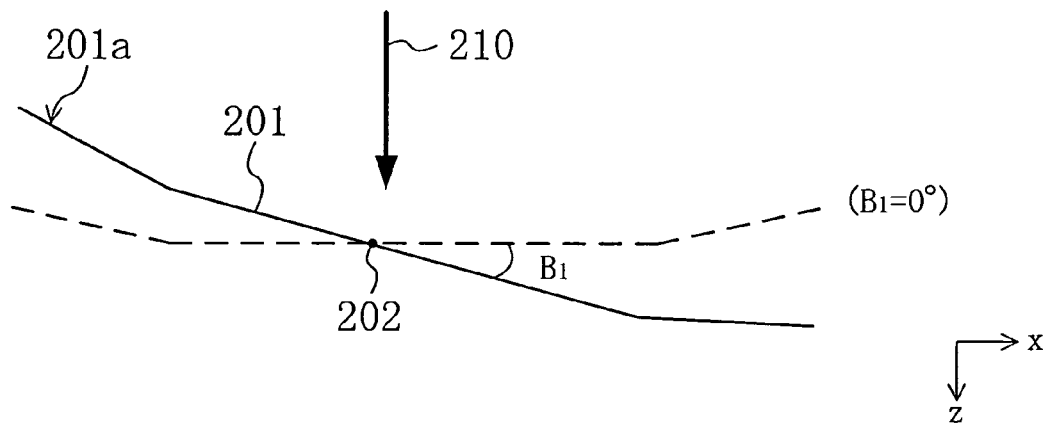
Figure 10C:
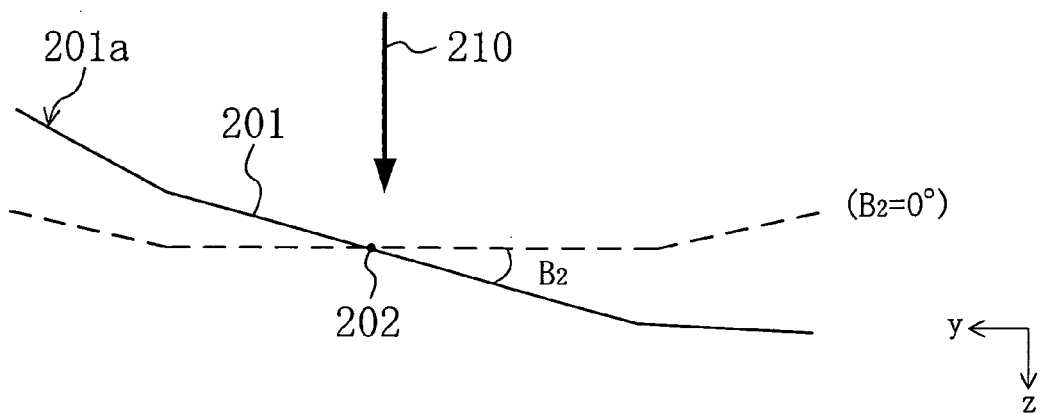

When changing the value of the twist angle, in a case where, for example, the conventional ion implantation device shown in FIG. 9 is used, the semiconductor wafer 11 itself is detached from the wafer holding area, rotated along the main surface of the semiconductor wafer with the center of the semiconductor wafer being the rotation axis, and then attached to the wafer holding area. With adjustments of the twist angle by rotating the semiconductor wafer in this way, the twist angle can be changed without changing the jyro angle of the disk, whereby the implantation angle of the impurity ions merely changes even though the distance from the center of the semiconductor wafer changes, so that it is possible to form the extension regions 17 symmetrical to the gate electrode 15A even at the periphery of the wafer.

Note that the energy of the ion implantation is, when using p-type boron ions as the second conductive-type impurity ions, set to be 2 keV or less, and when using n-type arsenic ions, set to be 5 keV or less. With such conditions, extension regions 17 of low concentration are formed, whereby a shallow junction can be formed in the channel region.

Figure 3A:
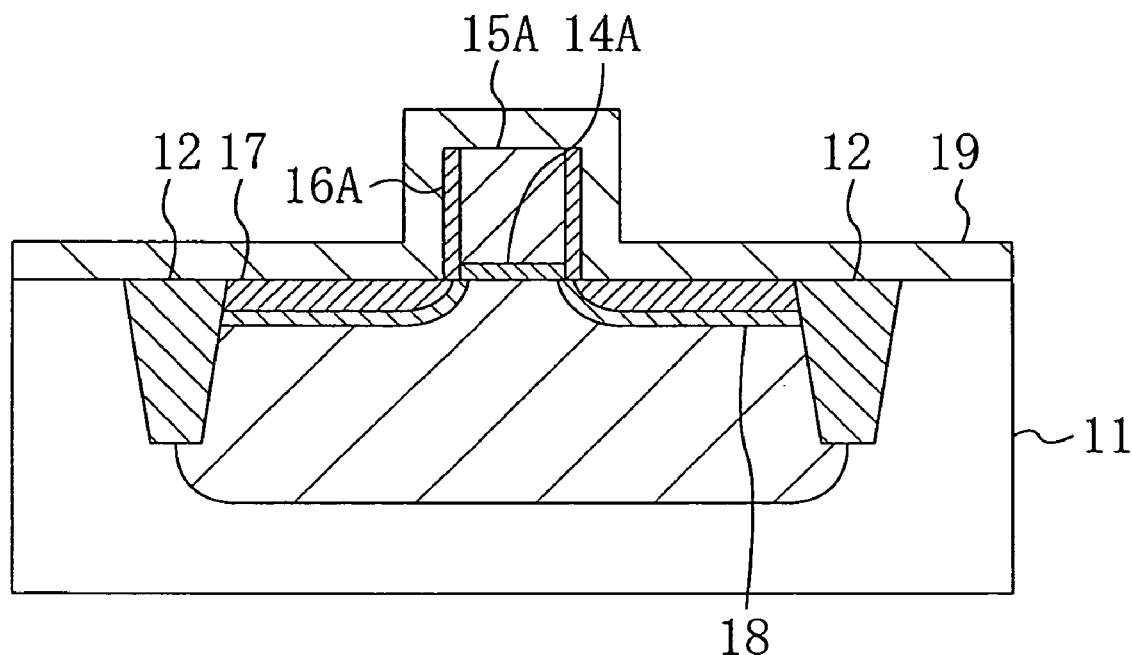
FIGS. 3A and 3B are structural sectional views in the order of steps showing the method for fabricating a semiconductor device according to the first embodiment of the present invention.

Next, as shown in FIG. 3A, ion implantation is performed using the gate electrode 15A and the first sidewalls 16A, to thereby form pocket regions 18 so as to cover the bottoms of the extension regions 17, by implanting the first conductive type impurity ions from an oblique direction to the both sides of the gate electrode 15A.

Then, on the semiconductor wafer 11, a second insulating film 19 made of oxide silicon is formed over the whole surface including the upper surfaces of the gate electrode 15A and the first sidewalls 16A.

Figure 3B:
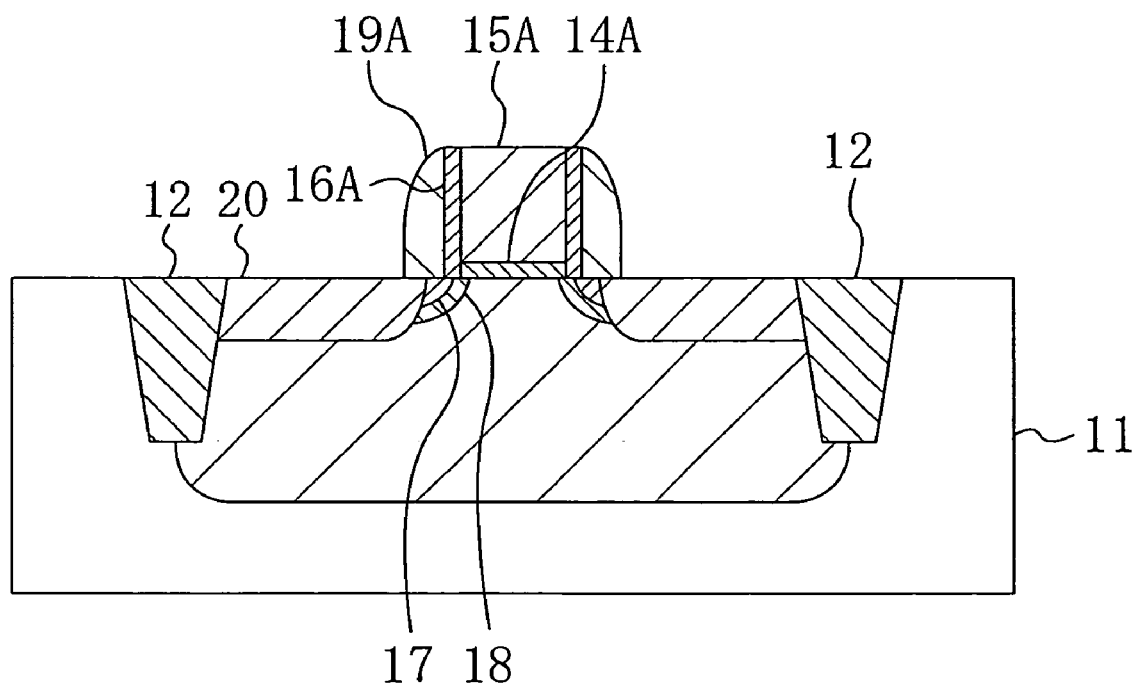

Next, as shown in FIG. 3B, the second insulating film 19 is etched from the top surface side, to thereby form second sidewalls 19A, from the second insulating film 19, covering the sides of the first sidewalls 16A. Then, ion implantation is performed using the second sidewalls 19A and the gate electrode 15A as masks, to thereby form second conductive-type source/drain regions 20 on the both sides of the gate electrode 15A so as to be positioned outside the extension regions 17.

With the aforementioned steps, the source/drain regions 20, forming a source diffusion region and a drain diffusion region, and the extension regions, connected with the source/drain regions 20 and having lower concentration than the source/drain regions, are formed in the well diffusion region 13, whereby a short channel effect can be suppressed. Further, since the pocket regions 18 of the conductive type opposite to that of the extension regions 17 are provided between the extension regions 17 and the channel region, spread of the depletion region in a lateral direction under the gate electrode 15A is suppressed, whereby a leakage current between the gate and the drain can be reduced.

Note that in the aforementioned steps, the second conductive type impurities of the extension regions 17 (first impurity ions) and the second conductive type impurities of the source/drain regions 20 (second impurity ions) may be of any conductive type provided that they are configured to have the same conductive type. For example, they may be p-type impurities such as boron, or n-type impurities such as arsenic. Further, the first conductive type impurities of the well diffusion region 13 and the second conductive type impurities of the pocket regions 18 (third impurity ions) may be of any conductive type provided that they have a conductive type different from that of the extension regions 17 and the source/drain regions 20.

Hereinafter, characteristics of the extension regions 17 formed by using the method for fabricating a semiconductor device according to the first embodiment will be described with reference to the drawings.

Figure 4A:
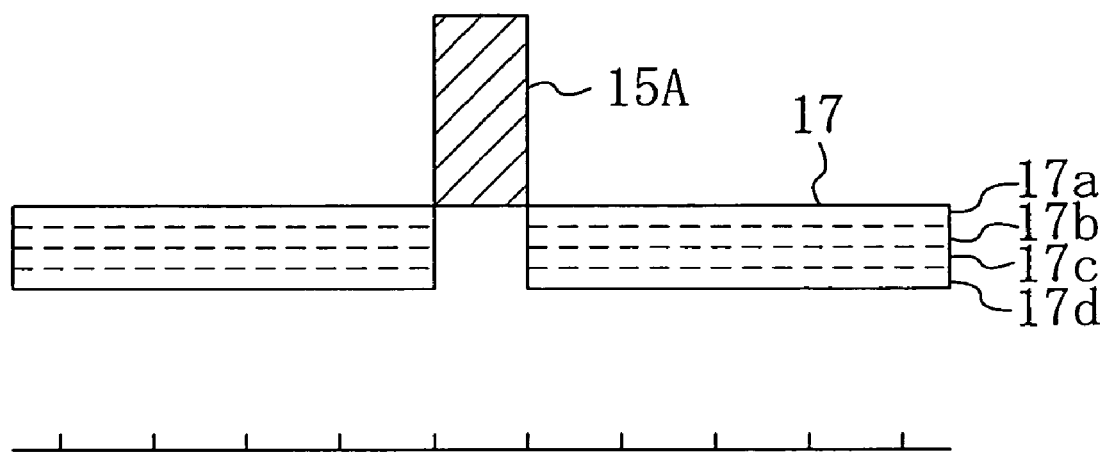
Figure 4B:
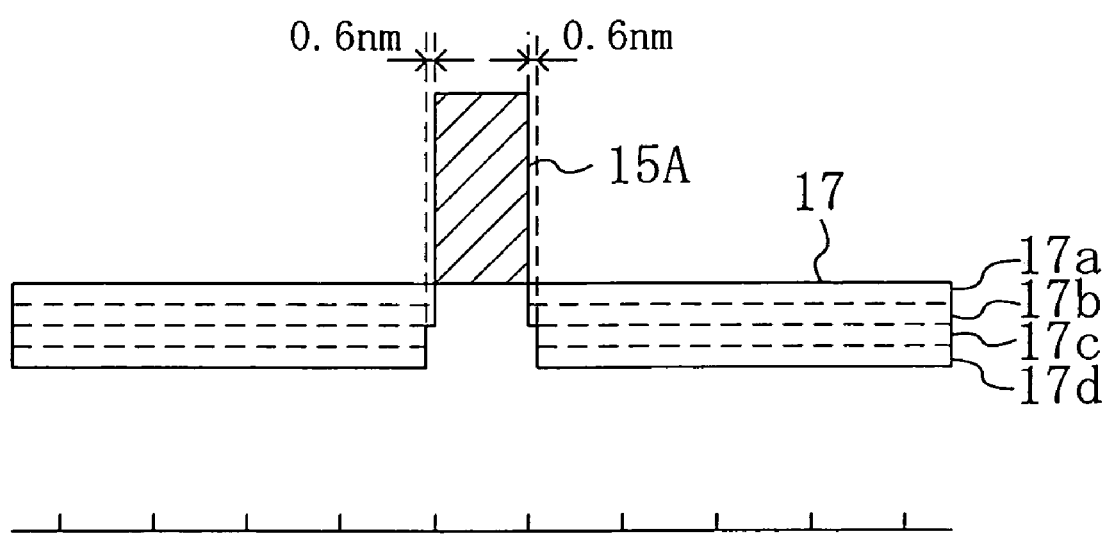

FIGS. 4A and 4B show sectional structures of the extension regions 17 formed by the method for fabricating a semiconductor device according to the first embodiment. FIG. 4A shows the extension regions 17 formed at the center of the semiconductor wafer 11, and FIG. 4B shows the extension regions 17 formed at the periphery of the semiconductor wafer 11. In FIGS. 4A and 4B, in the extension region 17, respective portions formed by ion implantations from the first time to the fourth time are shown as a first layered extension region 17a to a fourth layered extension region 17d.

As shown in FIG. 4A, in the center of the semiconductor wafer 11, the first layered extension regions 17a formed by the first ion implantation through the fourth layered extension regions 17d are formed so as to coincide with the side surfaces of the gate electrode 15A, so that the extension regions 17 are formed symmetrical to the gate electrode 15A.

Further, as shown in FIG. 4B, even at the periphery of the semiconductor wafer 11, the first layered extension region 17a and the second layered extension region 17b are formed so as to almost coincide with the side surfaces of the gate electrode 15A as well, and the third layered extension region 17c and the fourth layered extension region 17d are formed about 0.6 mm outside on the sides of the gate electrode 15A, however they are shifted by the almost same level. Thereby, the extension regions 17 are formed symmetrical to the gate electrode 15A.

Figure 5:
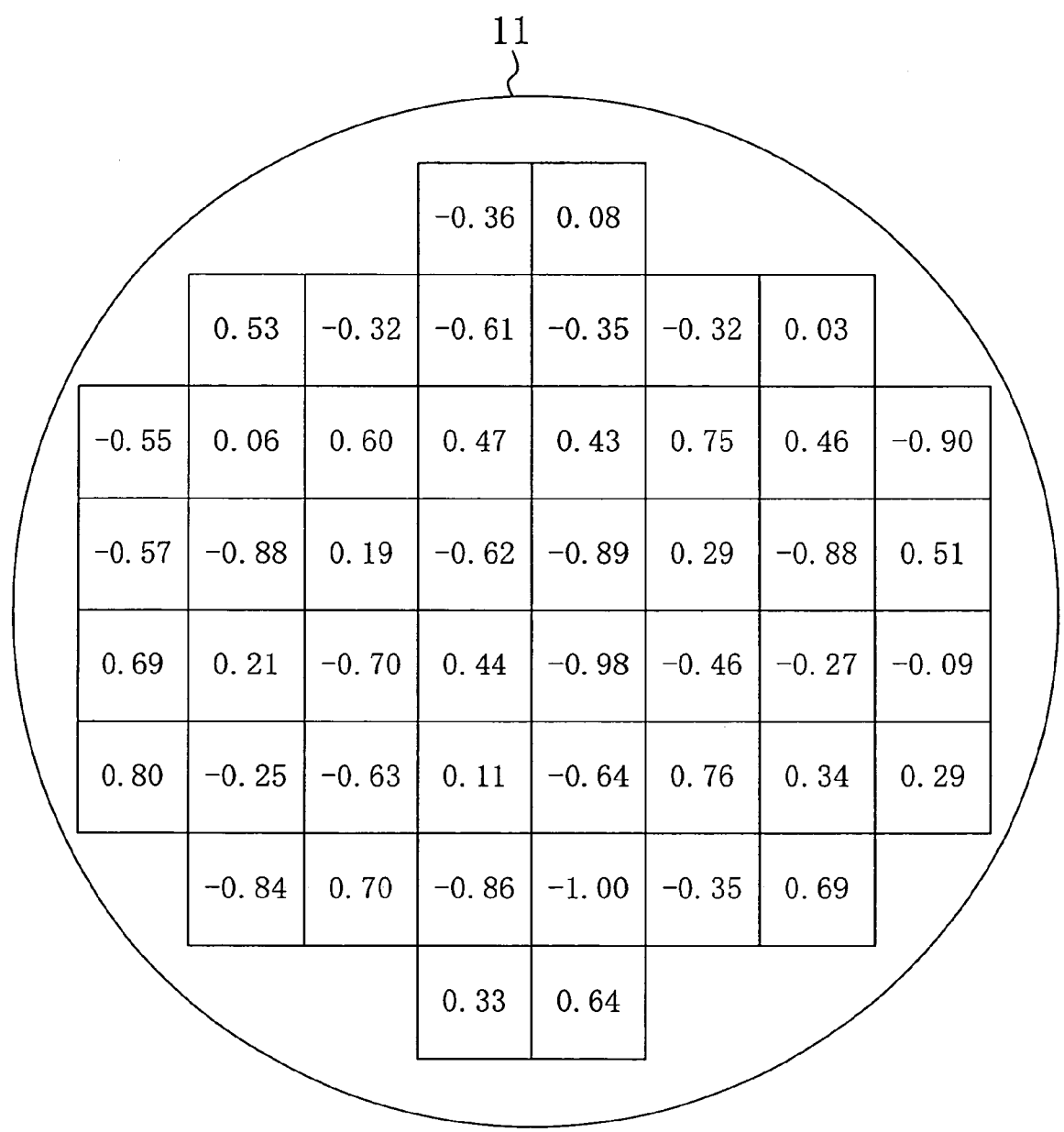
FIG. 5 is a map showing the distribution of the asymmetry of the source/drain in the semiconductor device formed by the method for fabricating a semiconductor device according to the first embodiment of the present invention.

FIG. 5 shows measurement results of the asymmetry of the source/drain in the semiconductor device according to the first embodiment, indicating the distribution of the asymmetry of the source/drain in the semiconductor wafer 11. Here, in a pair of source/drain regions 20 formed on the both sides of the gate electrode 15A, a drain current, when a forward bias voltage is applied so that one region becomes a source and the other becomes a drain, is measured as $I_{DS1}$, and a drain current, when a reverse bias current is applied to the pair of source/drain regions 20, is measured as $I_{DS2}$, whereby the asymmetry of the source/drain is calculated as $(I_{DS1}-I_{DS2})/I_{DS1}$.

As shown in FIG. 5, the asymmetry of the source/drain is formed to be 1% or less in almost all surfaces in the semiconductor wafer 11, whereby it is obvious that the extension regions 17 are formed with fine symmetry to the gate electrode 15A with high yield.

As described above, according the method for fabricating a semiconductor device according to the first embodiment, in the step of forming the extension regions 17, the semiconductor wafer 11 is rotated by 90° at each ion implantation of the four ion implantations, whereby it is possible to change the twist angle without changing the disk angle in the ion implantation device, so that implantation angle of the impurity ions merely differs at the center and at the periphery of the semiconductor wafer 11. Thereby, it is possible to form the extension regions 17 having fine symmetry with high yield.

Further, according to the method for fabricating a semiconductor device according to the first embodiment, even if the offset film thickness of the first sidewall 16A (that is, thickness of the bottom surface connected with the well diffusion region 13 in the first sidewall 16A) is formed to be 5 nm or more, it is possible to form the extension regions 17 without causing the asymmetry of the ion implantation.

Note that in the method for fabricating a semiconductor device according to the first embodiment, the tilt angle of the ion implantation in the step of forming the extension regions 17 is not limited to 0°, and it may be in a range of 0° to 10°. With the tilt angle of 10° or less, it is possible to form the extension regions 17 having fine symmetry with high yield, as same as the case of the tilt angle being 0°.

Further, in the method for fabricating a semiconductor device of the first embodiment, the twist angle of ion implantation in the step of forming the extension regions 17 is not limited to the configuration of the angle being changed by 90°, but may be changed by 90n° (provided that n is a natural number).

Further, in the method for fabricating a semiconductor device of the first embodiment, the number of times of ion implantations in the step of forming the extension regions 17 are not limited to four, but may be two or more.

In particular, when the number of times of ion implantations is a multiple of 2, it is preferable that the twist angle of the ion implantation be changed by 180n° (provided that n is a natural number), and when the number of times of ion implantations is a multiple of 4, it is preferable that the twist angle of the ion implantation be changed by 90n° (provided that n is a natural number). With this configuration, impurity ions can be implanted from certain directions corresponding to the number of times of ion implantations, whereby the extension regions 17 can be formed with fine symmetry.

Second Embodiment

Hereinafter, apparatus for fabricating a semiconductor device according to a second embodiment of the present invention will be described with reference to the drawings.

Figure 6A:
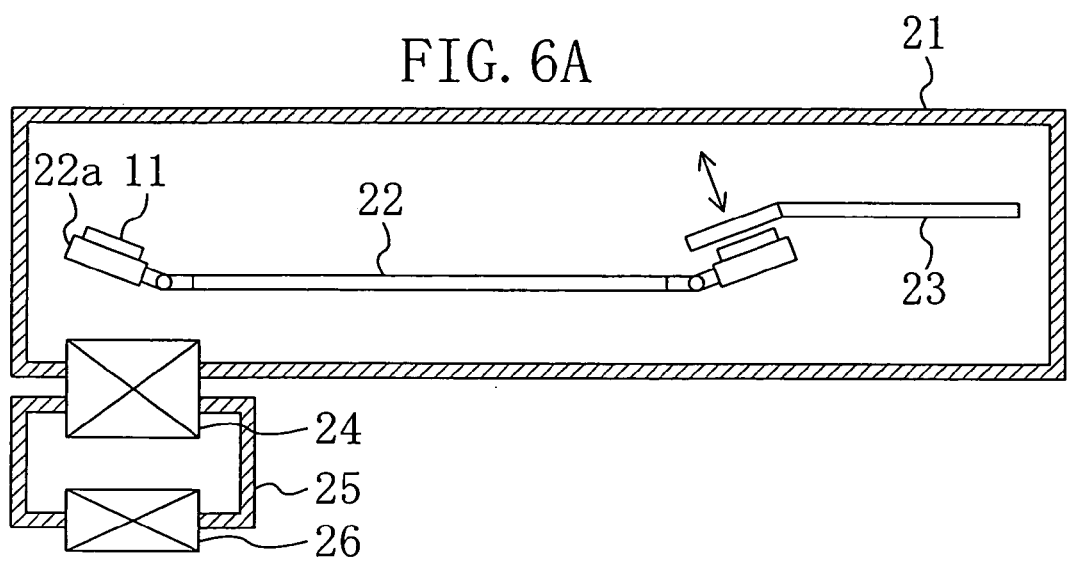
FIG. 6A is a structural sectional view showing apparatus for fabricating a semiconductor device according to a second embodiment of the present invention.
Figure 6B:
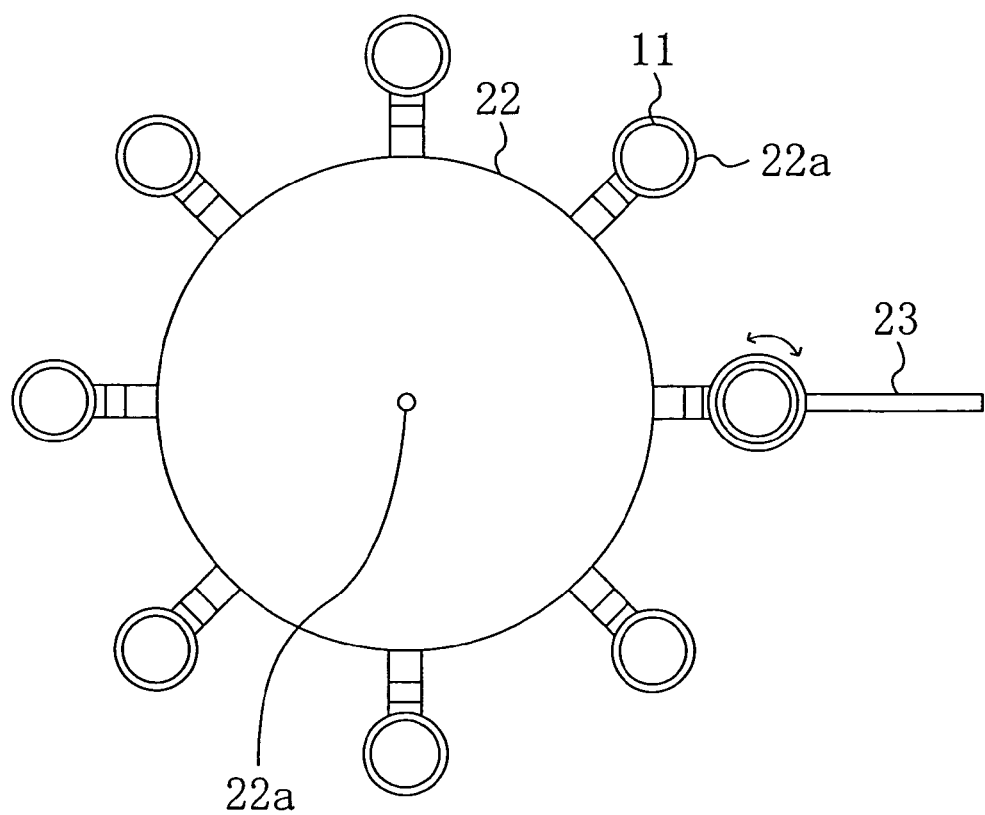
FIG. 6B is a plan view showing a disk in the apparatus for fabricating a semiconductor device of FIG. 6A.
Figure 7A:
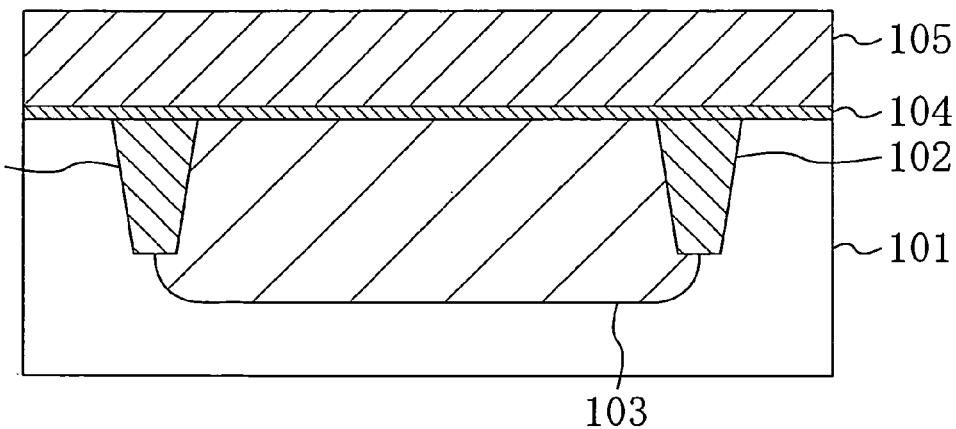
FIGS. 7A to 7C are structural sectional views in the order of steps showing a conventional method for fabricating a MOS transistor.
Figure 7B:
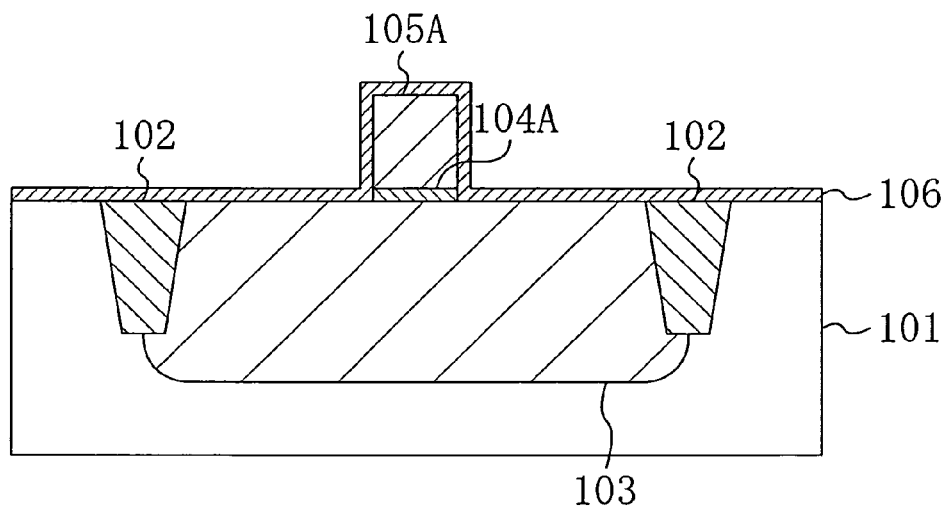
Figure 7C:
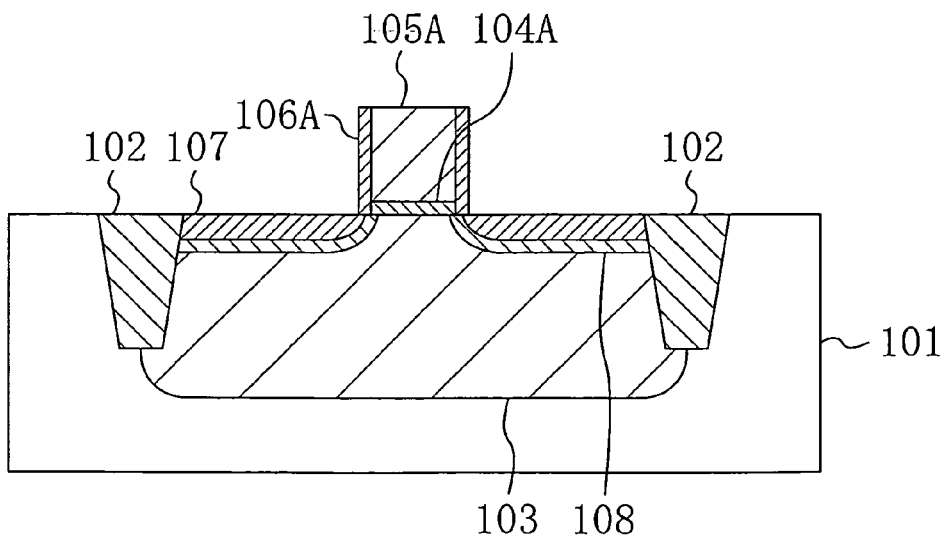
Figure 8A:
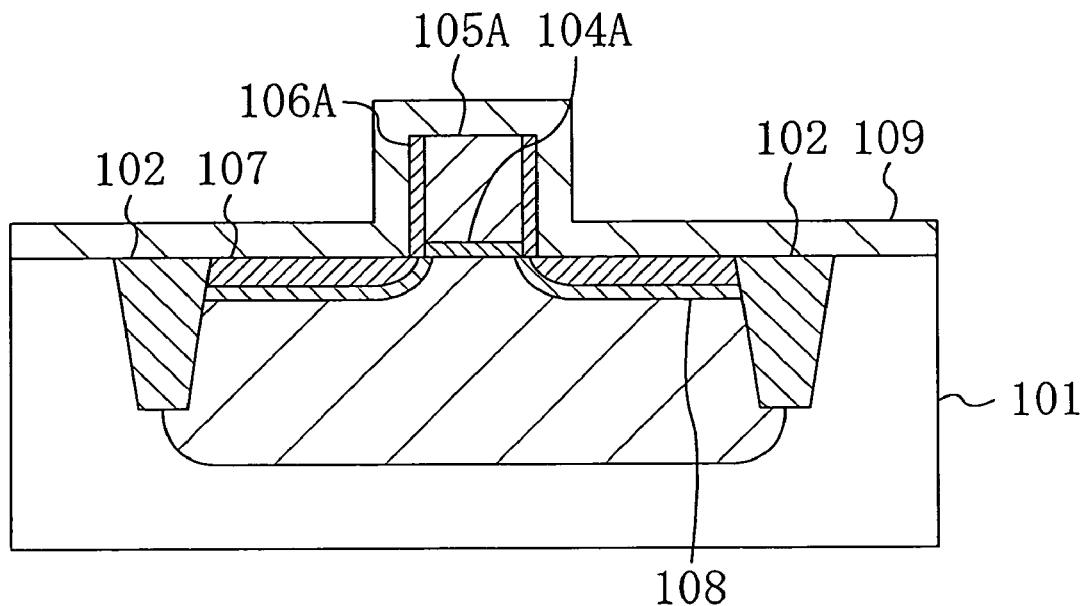
FIGS. 8A and 8B are structural sectional views in the order of steps showing the conventional method for fabricating a MOS transistor.
Figure 8B:
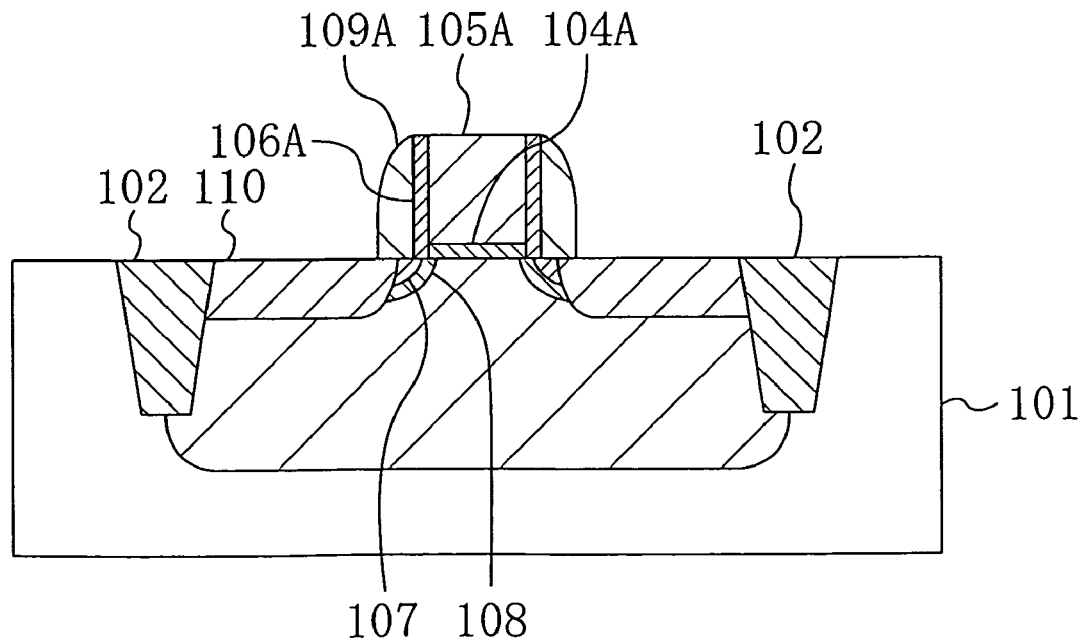

FIG. 6A shows the sectional structure of apparatus for fabricating a semiconductor device according to the second embodiment of the present invention, and FIG. 6B shows a planer shape of a disk in FIG. 6A.

As shown in FIGS. 6A and 6B, the apparatus for fabricating a semiconductor device according to the second embodiment comprises a reaction chamber 21 for generating impurity ions in the decompressed state, a disk 22 which is disposed in the reaction chamber 21 and has wafer holders 22a for holding the semiconductor wafers 11, and wafer rotator 23 which is disposed in the reaction chamber 21 and rotates a semiconductor wafer 11 along the main surface of the semiconductor wafer 11 with the center of the semiconductor wafer 11 being the rotation axis.

The wafer rotator 23 is so configured as to be movable vertically on the upper side of the wafer holder 22a. On the upper side of the wafer holder 22a, the wafer rotator 23 holds the edge of the semiconductor wafer 11, rotates it at an arbitrary angle, and then again loads the semiconductor wafer 11 on the wafer holder 22a. Thereby, the twist angle can be changed without changing the angle (jyro angle) of the disk 22.

Further, the reaction chamber 21 is connected with a load lock chamber 25 via a valve 24. When causing a semiconductor wafer 11 to be held by a wafer holder 22a in the reaction chamber 21, a valve 26 is released so as to introduce the semiconductor wafer 11 in the load lock chamber 25, and then the load lock chamber 25 is decompressed, and then the valve 24 is released so as to introduce the semiconductor wafer 11 in the reaction chamber 21.

When using the apparatus for fabricating a semiconductor device according to the second embodiment in the ion implantation step; an ion beam is irradiated to the semiconductor wafer 11 held by the wafer holder 22a, and the disk 22 is rotated about the disk rotation axis 22b and reciprocated along the scan axis (not shown), whereby irradiating the ion beam over the whole surface of the semiconductor wafer 11 and implanting impurity ions to the semiconductor wafer 11.

According to the apparatus for fabricating a semiconductor device of the second embodiment, the wafer rotator 23 for rotating the semiconductor wafer 11 is provided in the reaction chamber 21, whereby it is possible to rotate the semiconductor wafer 11 while keeping the inside of the reaction chamber 21 in the high vacuum state. Therefore, at the time of rotating a semiconductor wafer 11 for each ion implantation when performing a plurality of times of ion implantations, there is no need to take the semiconductor wafer 11 out of the reaction chamber 21 and the load lock chamber 25, which will not cause a decrease in the productivity of semiconductor devices.

Note that the wafer rotator 23 may be provided not in the reaction chamber but in the load lock chamber 25. Even in such a case, the semiconductor wafer 11 can be rotated while a plurality of times of ion implantations are performed without causing a decrease in the productivity of semiconductor devices since no period for exhausting the load lock chamber 25 is required, comparing with the case where the semiconductor wafer 11 is taken out from the load lock chamber 25.

As described above, the method and the apparatus for fabricating a semiconductor device according to the present invention have such an effect that semiconductor devices are formed with fine symmetry and high yield, and are useful as a method and apparatus for fabricating a semiconductor device having extension regions of low concentration connected with a source diffusion region and a drain diffusion region.

What is claimed is:

1. A method for fabricating a semiconductor device, comprising the steps of:
    forming a semiconductor region of a first conductive type on a semiconductor wafer;
    forming a gate electrode on the semiconductor region;
    forming a first insulating film over a whole surface including an upper surface of the gate electrode, on the semiconductor region;
    by removing the first insulating film through etching from an upper surface side, forming first sidewalls, covering side surfaces of the gate electrode, from the first insulating film; and
    by implanting first impurity ions of a second conductive type to the semiconductor region by using an ion implantation device capable of processing a plurality of semiconductor wafers simultaneously, forming first impurity diffusion regions on both sides of the gate electrode in the semiconductor region,
    wherein in the step of forming the first impurity diffusion regions, implantation of the first impurity ions are dividedly performed a plurality of times, and the semiconductor wafer is rotated about a center axis of the semiconductor wafer for each ion implantation by using a wafer rotator.

2. The method for fabricating a semiconductor device of claim 1, wherein the number of times of the first impurity ion implantations are multiples of 2.

3. The method for fabricating a semiconductor device of claim 2, wherein when implanting the first impurity ions dividedly a plurality of times, the semiconductor wafer is rotated by 180×n° (provided that n is a natural number).

4. The method for fabricating a semiconductor device of claim 1, wherein the number of times of the first impurity ion implantations is a multiple of 4.

5. The method for fabricating a semiconductor device of claim 4, wherein when implanting the first impurity ions dividedly a plurality of times, the semiconductor wafer is rotated by 90×n° (provided that n is a natural number).

6. The method for fabricating a semiconductor device of claim 1, wherein in the step of forming the first impurity diffusion regions, the first impurity ions are implanted such that an angle defined by a direction of implanting the first impurity ions and a vertical direction of a main surface of the semiconductor wafer is in a range of 0° to 10°.

7. The method for fabricating a semiconductor device of claim 1, wherein in the step of forming the first insulating film, a thickness of a portion, formed on the semiconductor region, of the first insulating film is set to be 5 nm or more.

8. The method for fabricating a semiconductor device of claim 1, furthercomprising the steps of:
    after the step of forming the first impurity diffusion regions, forming a second insulating film over a whole surface including upper surfaces of the gate electrode and the first sidewalls, on the semiconductor regions;

by removing the second insulating film through etching from an upper surface side, forming second sidewalls, covering the first sidewalls, from the second insulating film; and by implanting second impurity ions of a second conductive type to the semiconductor region, forming second impurity diffusion regions on both sides of the gate electrode in the semiconductor region so as to be positioned outside the first impurity diffusion regions.

9. The method for fabricating a semiconductor device of claim 8, further comprising the step of:

between the step of forming the first impurity diffusion regions and the step of forming the second insulating film, forming third impurity diffusion regions so as to cover bottoms of the first impurity diffusion regions by implanting third impurity ions of the first conductive type to the semiconductor region.

10. The method for fabricating a semiconductor device of claim 1, wherein the wafer rotator is configured to be movable vertically on the upper side of a wafer holder holding a backside of the semiconductor wafer, thereby implanting the first impurity ions such that a direction of implanting the first impurity ions becomes vertical to a main surface of the semiconductor wafer.

* * * * *